United States Patent
Hazucha et al.

(10) Patent No.: US 7,394,298 B2
(45) Date of Patent: Jul. 1, 2008

(54) STEPWISE DRIVERS FOR DC/DC CONVERTERS

(75) Inventors: Peter Hazucha, Beaverton, OR (US); Sung T. Moon, Hillsboro, OR (US); Gerhard Schrom, Hillsboro, OR (US); Tanay Karnik, Portland, OR (US); Vivek De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 678 days.

(21) Appl. No.: 10/919,672

(22) Filed: Aug. 16, 2004

(65) Prior Publication Data
US 2006/0033553 A1 Feb. 16, 2006

(51) Int. Cl.
*H03K 3/00* (2006.01)
(52) U.S. Cl. ........................ 327/108; 327/170
(58) Field of Classification Search ................. 327/108, 327/170, 83; 326/27, 83
See application file for complete search history.

(56) References Cited

U.S. PATENT DOCUMENTS

| | | | | |
|---|---|---|---|---|
| 5,450,023 A | * | 9/1995 | Yang et al. | 326/60 |
| 5,894,238 A | * | 4/1999 | Chien | 327/112 |
| 6,140,848 A | * | 10/2000 | Harvey | 327/112 |
| RE37,552 E | * | 2/2002 | Svensson et al. | 363/60 |
| 6,917,217 B2 | * | 7/2005 | Herz | 326/21 |
| 7,098,703 B2 | * | 8/2006 | Harvey | 327/111 |
| 7,126,308 B2 | * | 10/2006 | Shigeta et al. | 318/802 |
| 7,176,712 B2 | * | 2/2007 | Svensson et al. | 326/30 |

* cited by examiner

*Primary Examiner*—Kenneth B. Wells
(74) *Attorney, Agent, or Firm*—Blakely, Sokoloff, Taylor & Zafman LLP

(57) ABSTRACT

Stepwise drivers for DC/DC converters are described herein. In one embodiment, a stepwise driver is provided to charge or discharge a gate capacitance of a power switch of a DC/DC converter. In a particular embodiment, a stepwise driver example includes multiple switching elements to sequentially switch to charge a gate capacitance of a power switch of a DC/DC converter from a first voltage to a second voltage in multiple steps. Other methods and apparatuses are also described.

24 Claims, 12 Drawing Sheets

STEPWISE DRIVERS FOR DC/DC CONVERTERS

FIELD

Embodiments of the invention relate to DC/DC converters; and more specifically, to stepwise drivers for DC/DC converters.

BACKGROUND

Direct current to direct current (DC/DC) converters provide the capability to convert energy supplied by a power supply from one voltage and current level to another voltage and current level. Such circuits are widely employed in conjunction with computing platforms, such as personal computers, server nodes, laptop computers, and a variety of other computing systems. Such circuits are desirable because specifications for a processor typically employ lower voltages, such as 0.5 to 5 volts, and higher currents; such as, reaching 50 to over 100 amps, that may change over a relatively wide range with a relatively high slew rate.

DC/DC converters are desirable for providing voltage regulation under these conditions for a variety of reasons. One reason is because such circuitry may be placed relatively close to the board components, resulting in the capability to provide low local voltage tolerances due to higher switching frequencies, single output topology, and a reduction in resistance from shorter electrical connections.

Currently, power switches are driven by simple drivers which correspond to 1-step drivers. To save power in off-chip DC/DC converters, L-C resonant techniques have been used to charge capacitance via an inductor instead of a resistor. However, such techniques require an inductor that may occupy extra space and increase manufacturing cost. In addition, there is a need for high-frequency off-chip DC/DC converters in order to improve transient response when powering a microprocessor. There is also a need for a fully integrated high-frequency DC/DC converter in order to further improve transient response and reduce size.

BRIEF DESCRIPTION OF THE DRAWINGS

The invention may best be understood by referring to the following description and accompanying drawings that are used to illustrate embodiments of the invention. In the drawings.

DETAILED DESCRIPTION

Stepwise drivers for DC/DC converters are described herein. In one embodiment, a stepwise driver is used to charge gate capacitance of the power MOSFETs (metal oxide semiconductor field effect transistors) in a switching DC/DC converter, thereby reducing the switching loss; for example, ranging by approximately 30-50%, dependent upon the operating conditions and topology. In theory, the switching loss can be reduced to almost zero by using stepwise drivers with very large number of steps. Reduction of switching loss is important for increasing switching frequency of an off-chip or on-chip DC/DC converter, reduction of size of passive components and improvement of transient response.

In the following description, numerous specific details are set forth (e.g., such as logic resource partitioning/sharing/duplication implementations, types and interrelationships of system components, and logic partitioning/integration choices). However, it is understood that embodiments of the invention may be practiced without these specific details. In other instances, well-known circuits, software instruction sequences, structures and techniques have not been shown in detail in order not to obscure the understanding of this description.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives may be used. It should be understood that these terms are not intended as synonyms for each other. Rather, in particular embodiments, "connected" may be used to indicate that two or more elements are in direct contact with each other (e.g., physically, electrically, optically, etc.). "Coupled" may mean that two or more elements are in direct contact (physically, electrically, optically, etc.). However, "coupled" may also mean that two or more elements are not in direct contact with each other, but yet still co-operate or interact with each other.

Figure 1:
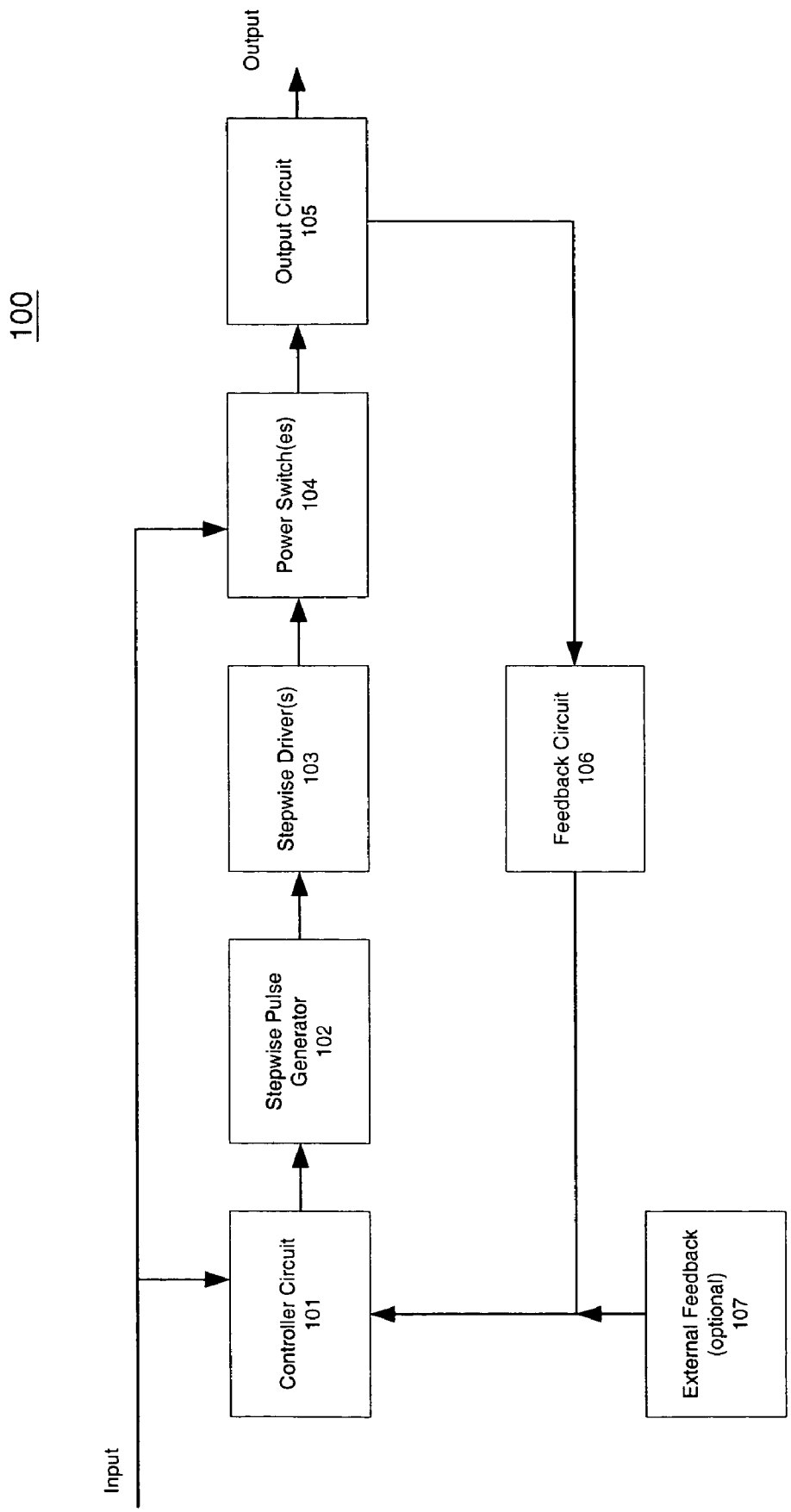
FIG. 1 is a block diagram illustrating a DC/DC converter having a stepwise driver according to one embodiment.

FIG. 1 is a block diagram illustrating a DC/DC converter having a stepwise driver according to one embodiment. The DC/DC converter example 100 may be, for example, a buck converter, a CUK converter, a flyback converter, a forward converter, or other types of DC/DC converters. In one embodiment, the DC/DC converter example 100 includes a controller circuit 101, a stepwise pulse generator 102, one or more stepwise drivers 103, one or more power switches 104, an output circuit 105, a feedback circuit 106, and an optional external feedback circuit 107.

In one embodiment, the controller circuit 101 receives input DC voltage and generates a clock signal having an appropriate duty cycle to enable output circuit 105 to provide a predetermined output voltage. In response to the clock signal received from the controller circuit, the stepwise pulse generator 102 may generate multiple signals having stepwise pulses. In one embodiment, each of the multiple signals includes a pulse that is not overlapped with the rest of the signals.

In one embodiment, at least one of the one or more stepwise drivers 103 may include multiple switching elements. Each of the switching elements may be coupled to one of the stepwise pulse signal received from the stepwise pulse generator 102. In response to the multiple pulse signals, according to one embodiment, the multiple switching elements of a stepwise driver 103 may sequentially switch to charge a gate capacitance of a power switch 104 from a first voltage to a second voltage in multiple steps. That is, contrary to a conventional DC/DC converter, the gate capacitance of the power switch 104 may be charged to at least one intermediate voltage between the first and second voltages, before being charged to the second voltage within a charging cycle of a switching cycle of the DC/DC converter. Similarly, in response to the stepwise pulse signals, the multiple switching elements of the stepwise driver 103 sequentially switch in a reversed order to discharge the gate capacitance of the power switch 104 during a discharge phase of the switching cycle of the DC/DC converter.

Output circuit 105 may include a rectifier and/or a filtering circuit. Feedback circuit 106 may be used to provide output information to the controller circuit 101 to allow the controller circuit 101 to adjust; for example, the duty cycle of a next switching cycle of the converter. Optionally, the external feedback circuit 107 may be used to provide further feedback information from a device external to the converter; for example, a microprocessor of a computer system. Other components may also be included.

Figure 2:
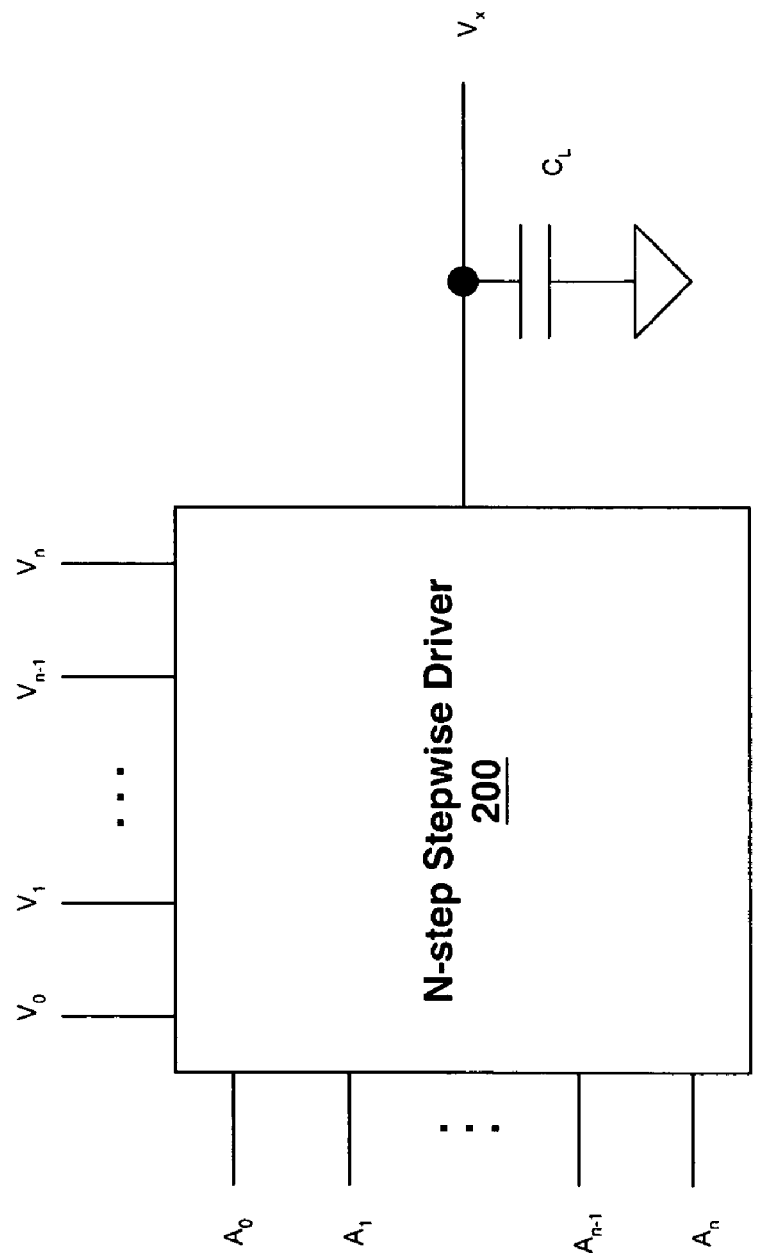
FIG. 2 is a block diagram illustrating a stepwise driver for a DC/DC converter according to one embodiment.

FIG. 2 is a block diagram illustrating a stepwise driver for a DC/DC converter according to one embodiment. The stepwise driver 200 may be implemented as an example of stepwise driver 103 of the DC/DC converter 100 shown in FIG. 1. In one embodiment, the stepwise driver example 200 includes, but is not limited to, multiple switching elements to sequentially switch to charge a gate capacitance of a power switch of a DC/DC converter from a first voltage to a second voltage in multiple steps.

The switching energy consumed for resistive charging and discharging of capacitance $C_L$ equals $E=C_L\Delta V^2$, where $\Delta V$ is the voltage swing. If a single transition of $\Delta V$ can be divided into N transitions, each of $\Delta V/N$, then the total energy would be reduced N times as given by $E_N=N\times C_L(\Delta V/N)^2=E/N$. A purpose of an N-step stepwise driver is to charge and discharge capacitance $C_L$ in N steps rather than a single step. The driver makes use of N+1 voltage rails $V_0 < \ldots < V_N$ and N+1 control signals $A_0 \ldots A_N$. The step sizes are given by the voltage differences among the rails $V_0 \ldots V_N$.

Figure 3:
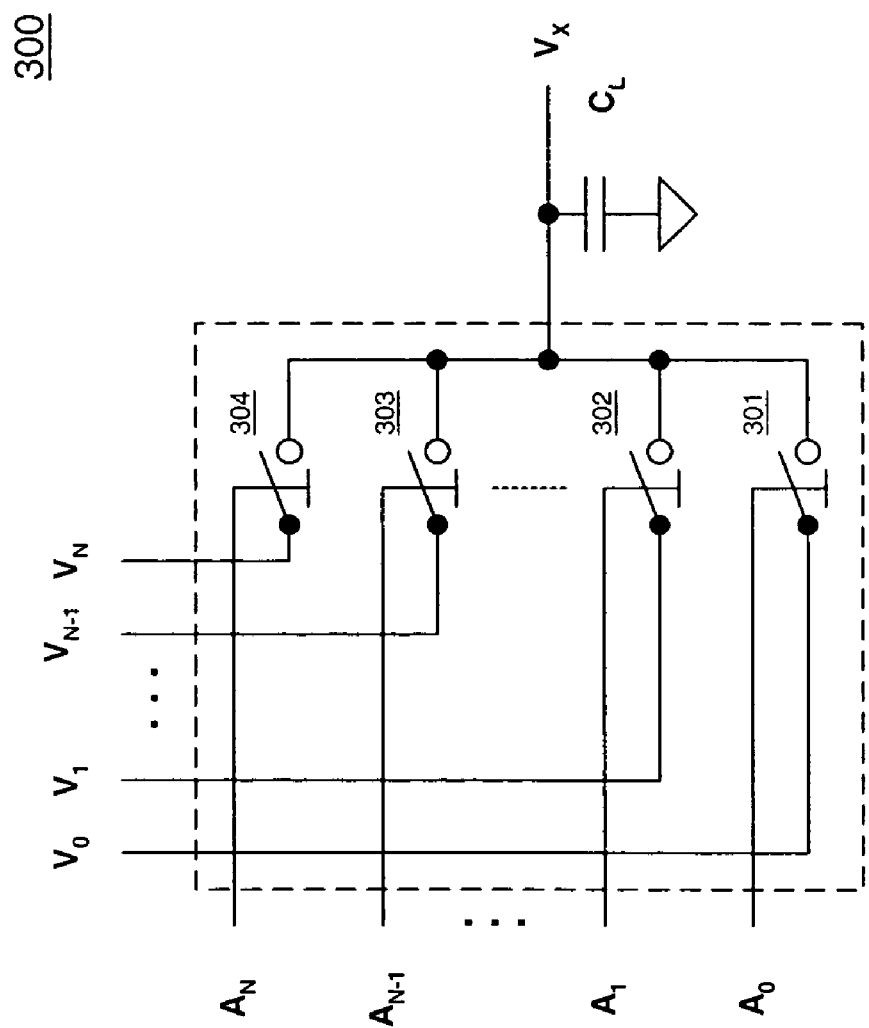
FIG. 3 is a block diagram illustrating a stepwise driver for a DC/DC converter according to one embodiment.

FIG. 3 is a block diagram illustrating a stepwise driver for a DC/DC converter according to one embodiment. The stepwise driver 300 may be implemented as an example of stepwise driver 200 of FIG. 2 or stepwise driver 103 of FIG. 1. Referring to FIG. 3, in this embodiment, generic switches 301-304 may be used to successively charge a gate capacitance $C_L$ of a power switch from $V_0$ to $V_1, \ldots$ to $V_N$ by successively turning on switches 301-304 connected to $A_0 \ldots A_N$. Discharging is performed by activating the switches 301-304 in a reverse order. In one embodiment, at most one switch is turned on at any time.

For example, referring to FIG. 3, initially, switch 301 is on in response to control signal $A_0$, which charges the gate capacitance $C_L$ to $V_0$. Subsequently, after $C_L$ has been charged to $V_0$, switch 302 is on while turning off switch 301. As a result, $C_L$ has been charged from $V_0$ to $V_1$. Similarly, the $C_L$ is charged eventually to $V_N$ within a single switching cycle of a DC/DC converter, by sequentially turning on switches from switch 301 to switch 304, where only one of the switches 301-304 is turned on at a given time.

During a discharge phase of the switching cycle, the gate capacitance $C_L$ will be discharged in multiple steps from $V_N$ to $V_0$. Specifically, the switches 301-304 are turned on sequentially in a reversed order (e.g., from switch 304 to switch 301) to allow the gate capacitance $C_L$ to be discharged in multiple steps.

Figure 4A:
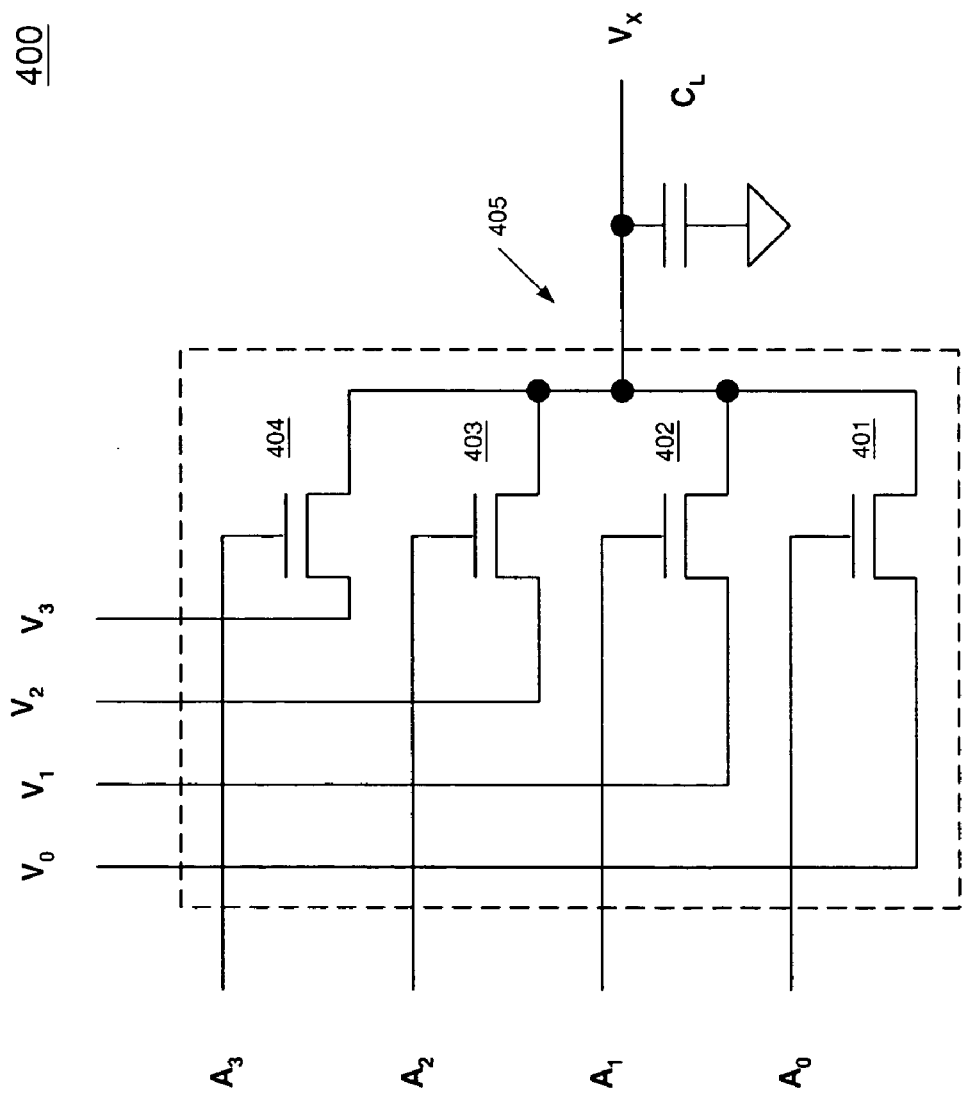
FIG. 4A is a block diagram illustrating a stepwise driver of a DC/DC converter according to another embodiment.
Figure 4B:
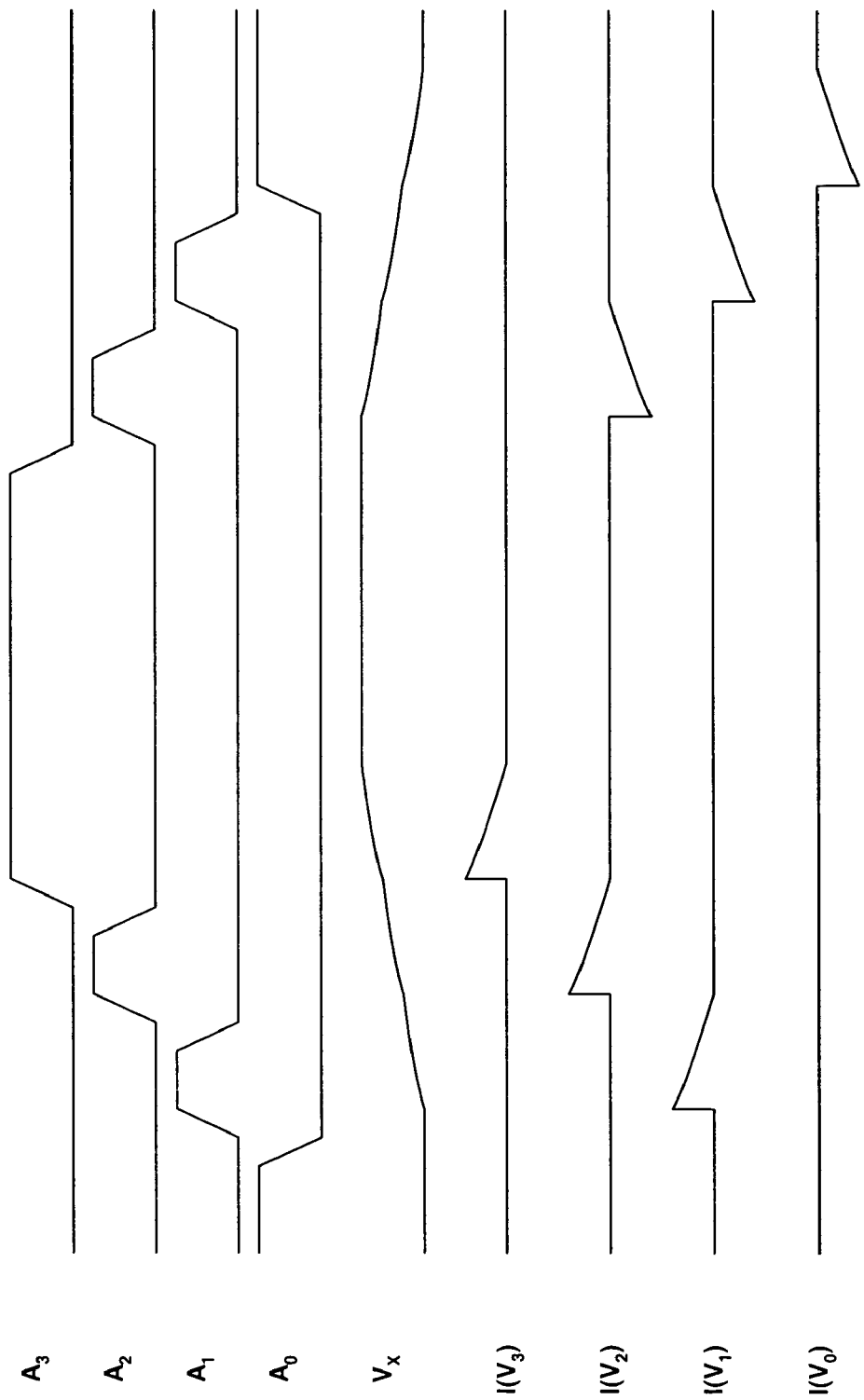
FIG. 4B is a timeline diagram illustrating timing of the sequential switching by the switching elements of FIG. 4A according to one embodiment.

FIG. 4A is a block diagram illustrating a stepwise driver of a DC/DC converter according to another embodiment. For example, stepwise driver 400 may be implemented as an example of stepwise driver 200 of FIG. 2. In this embodiment, for the purposes of illustration, the stepwise driver example 400 is a 3-step driver, where an n-channel field effect transistor (nFET) may be used as a switching element. More or less steps may be implemented within a stepwise driver. In one embodiment, since this is a 3-step driver, the stepwise driver 400 includes four nFETs 401-404 coupled to and controlled by control signals $A_0$ to $A_3$. In one embodiment, the nFETs 401-404 may sequentially switch in response to control signals $A_0$ to $A_3$ respectively to charge or discharge a gate capacitance $C_L$ from a first voltage $V_0$ to a second voltage $V_3$ in multiple steps via intermediate voltages $V_1$ and $V_2$, where voltages $V_0$ to $V_3$ are supplied by multiple supply rails. FIG. 4B is a timing diagram illustrating timing of the sequential switching by the switching elements of FIG. 4A according to one embodiment.

Specifically, referring to FIG. 4A, the sources of the nFETs 401-404 are coupled to each other to form a node 405. Node 405 may be coupled to a gate of a power switch of a DC/DC converter, where the gate of the power switch may include capacitance $C_L$. The gates of the nFETs 401-404 may be coupled to an input circuit to receive the control signals $A_0$ to $A_3$ respectively. The drains of the nFETs 401-404 are coupled to multiple supply rails to receive voltages $V_0$ to $V_3$, respectively.

Referring to FIGS. 4A and 4B, initially, during a charge phase of a switching cycle of a DC/DC converter, control signal $A_0$ is asserted while other control signals $A_1$ to $A_3$ are de-asserted. In this embodiment, a control signal is asserted when it is at a logical high level and is de-asserted when it is at a logical low level. As a result, nFET 401 is turned on while nFETs 402-404 are turned off. Node 405 is charged to a voltage substantially equivalent to $V_0$, which is fed to node 405 via the turned-on nFET 401.

Subsequently and sequentially, control signal $A_1$ is asserted while control signals $A_0$ and $A_2$-$A_3$ are de-asserted. As a result, nFET 402 is turned on while the rest of nFETs 401 and 403-404 are turned off by the control signals $A_0$ and $A_2$-$A_3$ respectively. Thus, node 405 is charged from $V_0$ to a voltage substantially equivalent to $V_1$, which is fed to node 405 via the turned-on nFET 402 during the respective charge step. Similarly, the node 405 may be charged from $V_1$ to $V_2$ and from $V_2$ to $V_3$, etc. by sequentially turning on nFETs 403 and 404.

During a discharge phase of a switching cycle of a DC/DC converter, according to one embodiment, control signals. $A_0$ to $A_3$ are sequentially asserted in a reversed order with respect to those during the charge phase. As a result, nFETs 401 to 404 are sequentially turned on in a reversed order with respect to those during the charge phase. Thus, node 405 is discharged from $V_3$ to $V_2$, from $V_2$ to $V_1$, and from $V_1$ to $V_0$ in multiple discharge steps.

Referring to FIG. 4B, according to one embodiment, during the charge and discharge phases of a switching cycle, for equal step sizes, the total charge to the intermediate voltages (e.g., $V_1$ and $V_2$) are substantially zero. As a result, the intermediate rails supplying $V_1$ and $V_2$ may not require to couple to a power supply. Rather, an AC (alternating current) coupling device, for example, a capacitor, may be used to couple the intermediate rails to one of the rails supplying $V_0$ and $V_3$, similar to configuration example 700 of FIG. 7. The size and characteristics of the AC coupling device may be selected to suppress the excessive fluctuations of the intermediate rails.

Specifically, when $C_L$ is discharged during a discharge phase of the switching cycle, the AC coupling devices coupled to the intermediate rails may be charged using the energy discharged from the $C_L$. The energy stored in the AC coupling devices may be used to charge $C_L$ in a next charge phase of a next switching cycle of a DC/DC converter. As a result, a power supply for the intermediate rails may not be needed and the power consumed may be further reduced.

Figure 5A:
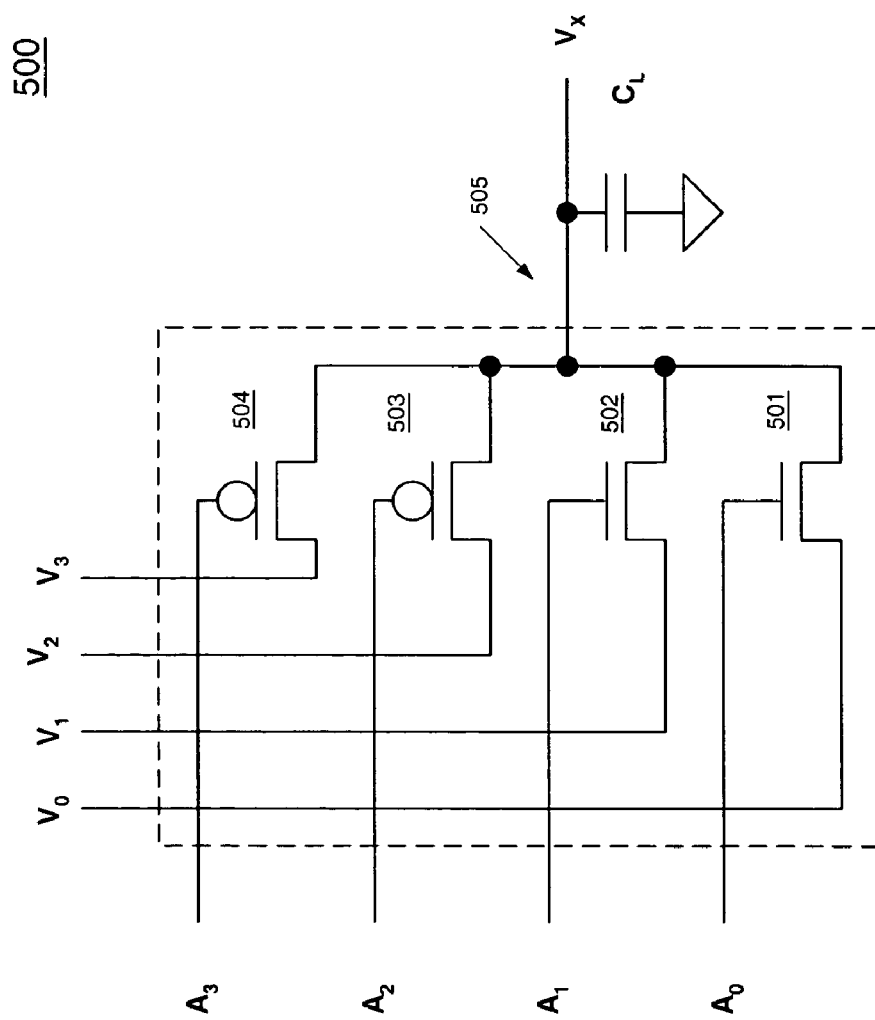
FIG. 5A is a block diagram of illustrating a stepwise driver of a DC/DC converter according to another embodiment.
Figure 5B:
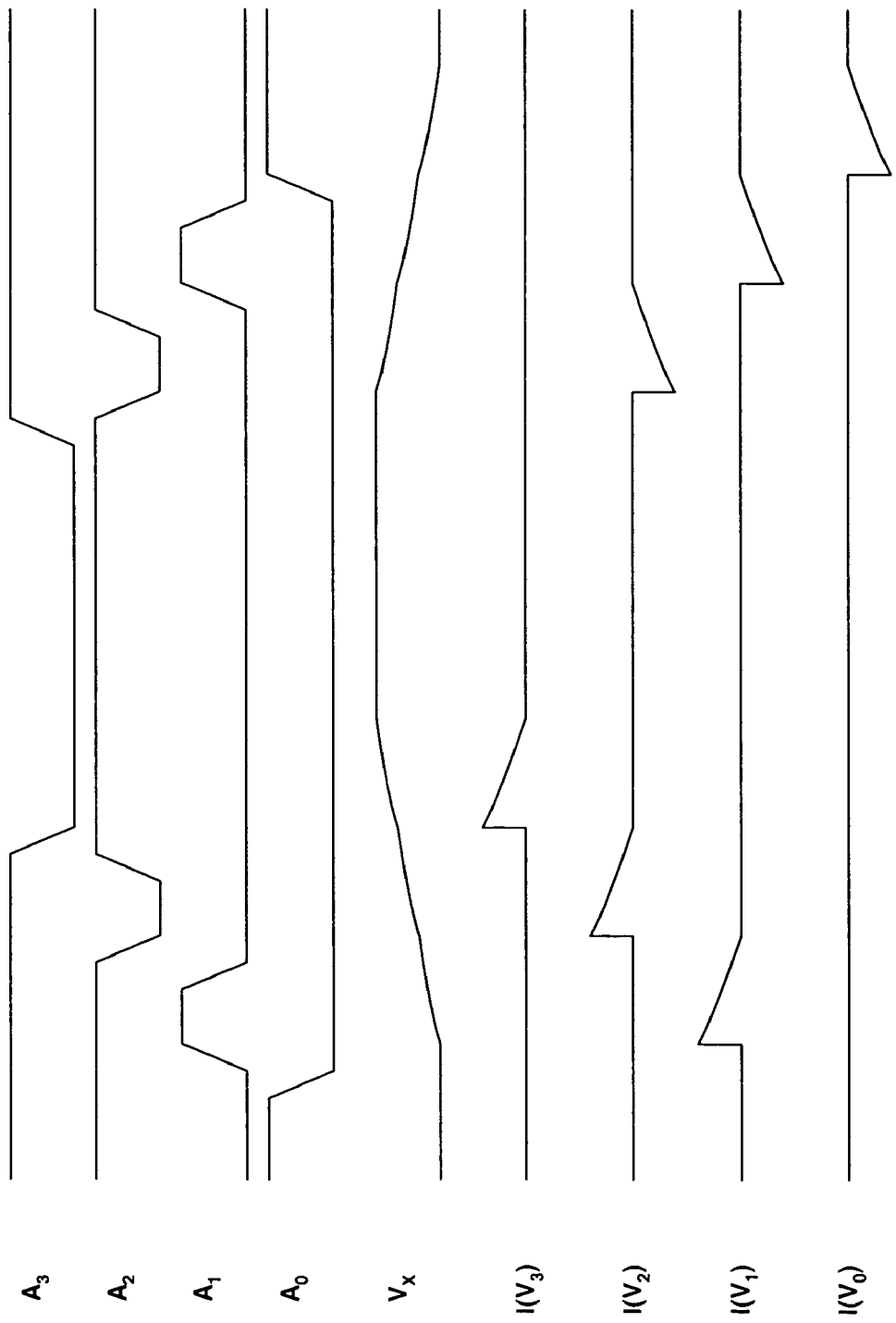
FIG. 5B is a timeline diagram illustrating timing of the sequential switching by the switching elements of FIG. 5A according to one embodiment.

FIG. 5A is a block diagram illustrating a stepwise driver of a DC/DC converter according to another embodiment. For example, stepwise driver 500 may be implemented as an example of stepwise driver 200 of FIG. 2. In this embodiment, similar to stepwise driver example 400 of FIG. 4, the stepwise driver example 500 is a 3-step driver. More or less steps may be implemented within a stepwise driver. In one embodiment, in addition to an nFET being a switching element, a p-channel FET (pFET) may also be used as a switching element. In one embodiment, the stepwise driver 500 includes two nFETs 501-502 and two pFETs 503-504 coupled to and controlled by control signals $A_0$ to $A_3$. In one embodiment, the FETs 501-504 may sequentially switch in response to control signals $A_0$ to $A_3$; respectively, to charge or discharge a gate capacitance $C_L$ from a first voltage $V_0$ to a second voltage $V_3$ in multiple steps via intermediate voltages $V_1$ and $V_2$, where voltages $V_0$ to $V_3$ are supplied by multiple supply rails. FIG. 5B is a timing diagram illustrating timing of the sequential switching by the switching elements of FIG. 5A according to one embodiment.

Specifically, referring to FIG. 5A, the sources of the FETs 501-504 are coupled to each other to form a node 505. Node 505 may be coupled to a gate of a power switch of a DC/DC converter, where the gate of the power switch may include capacitance $C_L$. The gates of the FETs 501-504 may be coupled to an input circuit to receive the control signals $A_0$ to $A_3$ respectively. The drains of the FETs 501-504 are coupled to multiple supply rails to receive voltages $V_0$ to $V_3$ respectively.

Referring to FIGS. 5A and 5B, initially, during a charge phase of a switching cycle of a DC/DC converter, control signal $A_0$ is asserted while other control signals $A_1$ to $A_3$ are de-asserted. In this embodiment, control signals $A_0$, $A_1$ are asserted when at a logical high level and de-asserted when at a logical low level. In this embodiment, control signals $A_2$, $A_3$ are asserted when at a logical low level and de-asserted when at a logical high level. As a result, nFET 501 is turned on while FETs 502-504 are turned off. Node 505 is charged to a voltage substantially equivalent to $V_0$, which is fed to node 505 via the turned-on nFET 501.

Subsequently and sequentially, control signal $A_1$ is asserted while control signals $A_0$ and $A_2$-$A_3$ are de-asserted. As a result, nFET 502 is turned on while the rest of nFET 501 and pFETs 503-504 are turned off by the control signals $A_0$ and $A_2$-$A_3$ respectively. Thus, node 505 is charged from $V_0$ to a voltage substantially equivalent to $V_1$, which is fed to node 505 via the turned-on nFET 502 during the respective charge step. Similarly, the node 505 may be charged from $V_1$ to $V_2$ and from $V_2$ to $V_3$, etc. by sequentially turning on pFETs 503 and 504. However, since FETs 503 and 504 are pFETs, the corresponding control signals $A_2$ and $A_3$ are asserted by pulling the signals to a logical low level in order to turn pFETs 503 and 504 on, as shown in FIG. 5B. Note that the types of the FETs may be selected dependent upon a particular application in order to minimize power consumption, area of the switches, and/or transition time, etc.

During a discharge phase of a switching cycle of a DC/DC converter, according to one embodiment, control signals $A_0$ to $A_3$ are sequentially asserted in a reversed order with respect to those during the charge phase. As a result, nFETs 501-502 and pFETs 503-504 are sequentially turned on in a reversed order with respect to those during the charge phase. Thus, node 505 is discharged from $V_3$ to $V_2$, from $V_2$ to $V_1$, and from $V_1$ to $V_0$ in multiple discharge steps.

Referring to FIG. 5B, according to one embodiment, during the charge and discharge phases of a switching cycle, for equal step sizes, the total charge to the intermediate voltages (e.g., $V_1$ and $V_2$) are substantially zero. As a result, the intermediate rails supplying $V_1$ and $V_2$ may not require to couple to a power supply. Rather, an AC (alternate current) coupling device, for example, a capacitor, may be used to couple the intermediate rails to one of the rails supplying $V_0$ and $V_3$, similar to configuration example 700 of FIG. 7. The size and characteristics of the AC coupling device may be selected to suppress the excessive fluctuations of the intermediate rails.

Specifically, when $C_L$ is discharged during a discharge phase of the switching cycle, the AC coupling devices coupled to the intermediate rails may be charged using the energy discharged from the $C_L$. The energy stored in the AC coupling devices may be used to charge $C_L$ in a next charge phase of a next switching cycle of a DC/DC converter. As a result, a power supply for the intermediate rails may not needed and the power consumed may be further reduced. Note that the switching elements are not limited to an FET or a pFET. Other types of components or devices may be used as a switching element in a stepwise driver for a DC/DC converter.

Figure 6:
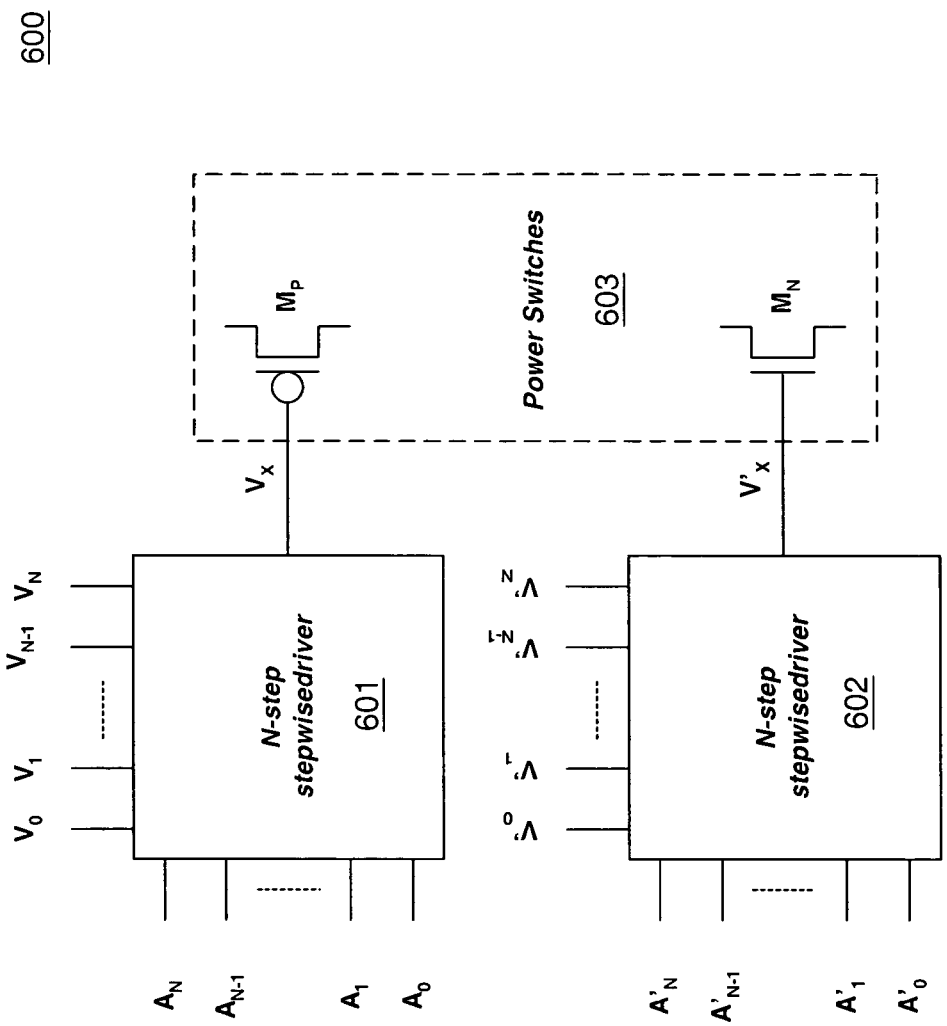
FIG. 6 is a block diagram of a DC/DC converter according to one embodiment.

FIG. 6 is a block diagram of a DC/DC converter according to one embodiment. For example, the DC/DC converter example 600 may be implemented as an example of the DC/DC converter 100 of FIG. 1. In one embodiment, the DC/DC converter example 600 includes, but is not limited to, a power switch, and a driver circuit coupled to the power switch, the driver circuit including a plurality of switching elements to sequentially switch to charge a gate capacitance of the power switch from a first voltage to a second voltage in a plurality of steps.

Referring to FIG. 6, the DC/DC converter example 600 include one or more stepwise drivers 601-602 to drive one or more power switches 603. In this embodiment, for the purposes of illustration, two stepwise drivers are used to drive two power switches. However, they are not so limited. More or less stepwise drivers may be implemented to drive more or less power switches of a DC/DC converter. In addition, any one of the stepwise drivers 601 and 602 may be implemented as an example of any stepwise driver shown in FIGS. 2, 3, 4A, and 5A as described above. Furthermore, for the purposes of illustration, stepwise drivers 601 and 602 are illustrated as N-step drivers. It is important to know that N may represent any number that is greater than one. In one embodiment, each or some of the stepwise drivers are controlled by independent control signals (e.g., $A_0$-$A_N$ and $A'_0$-$A'_N$) and power from separate voltage rails (e.g., $V_0$-$V_N$ and $V'_0$-$V'_N$). Alternatively, some or all of the voltage rails may be shared among the stepwise drivers. Other configurations may exist.

Figure 7:
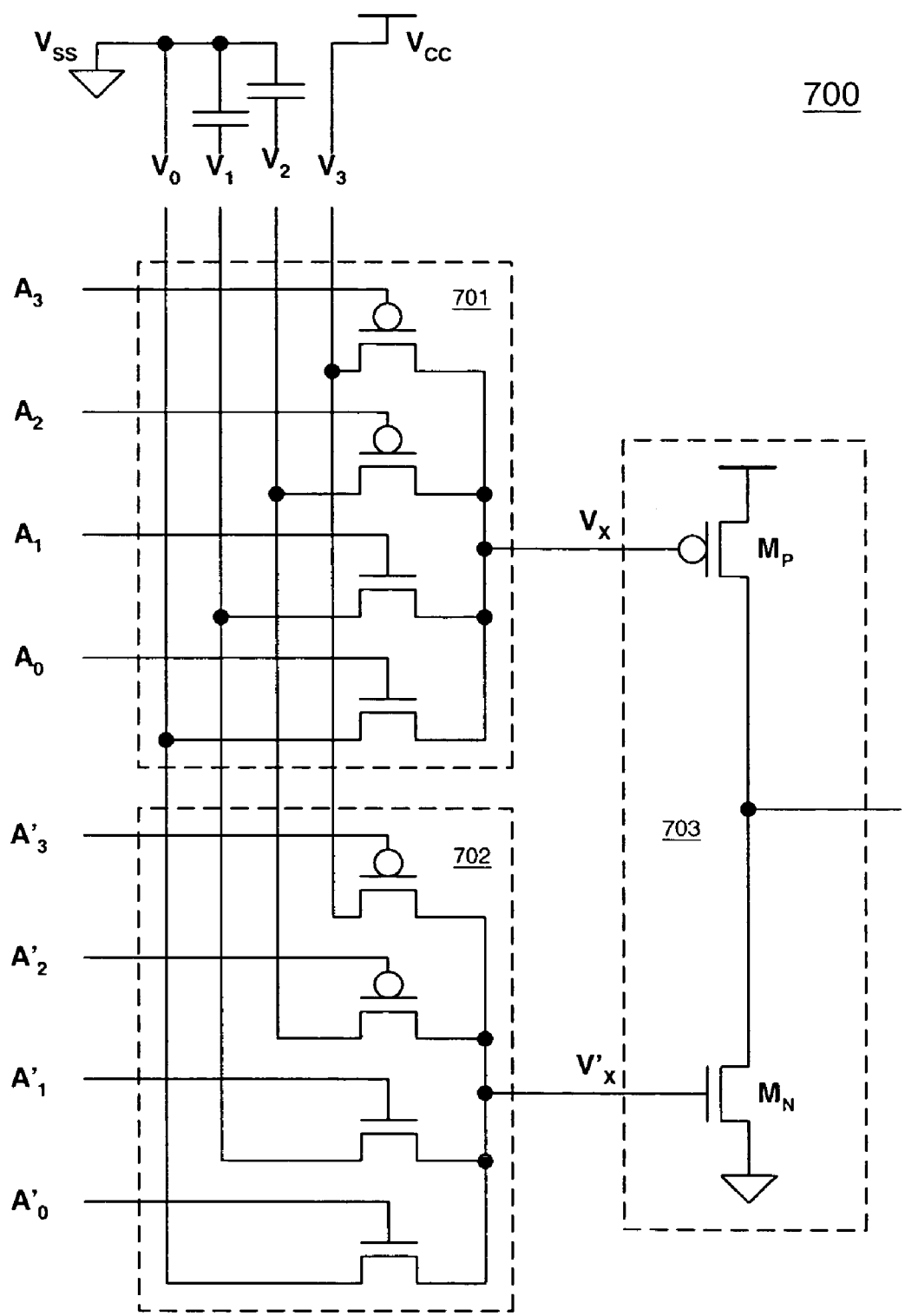
FIG. 7 is a block diagram of a DC/DC converter according to another embodiment.

FIG. 7 is a block diagram of a DC/DC converter according to another embodiment. For example, the DC/DC converter example 700 may be implemented as an example of the DC/DC converter 100 of FIG. 1 and/or the DC/DC converter 600 of FIG. 6. Similar to DC/DC converter example 600 of FIG. 6, the DC/DC converter example 700 includes one or more stepwise drivers 701-702 to drive one or more power switches 703 of the DC/DC converter. In this embodiment, for the purposes of illustration, the stepwise drivers 701-702 are illustrated as a 3-step driver similar to the one shown in FIG. 5A. However, they are not so limited. More or less drivers and/or more or less steps in each driver may be implemented.

In addition, as shown in FIG. 7, multiple stepwise drivers may share some or all of the corresponding supply rails. As a result, when an AC coupling device is used in an intermediate supply rail, this configuration reduces the amount of the decoupling capacitance (e.g., AC coupling devices) required for the intermediate supply rails because the supply rails are shared by multiple drivers. Other configurations may exist.

Figure 8:
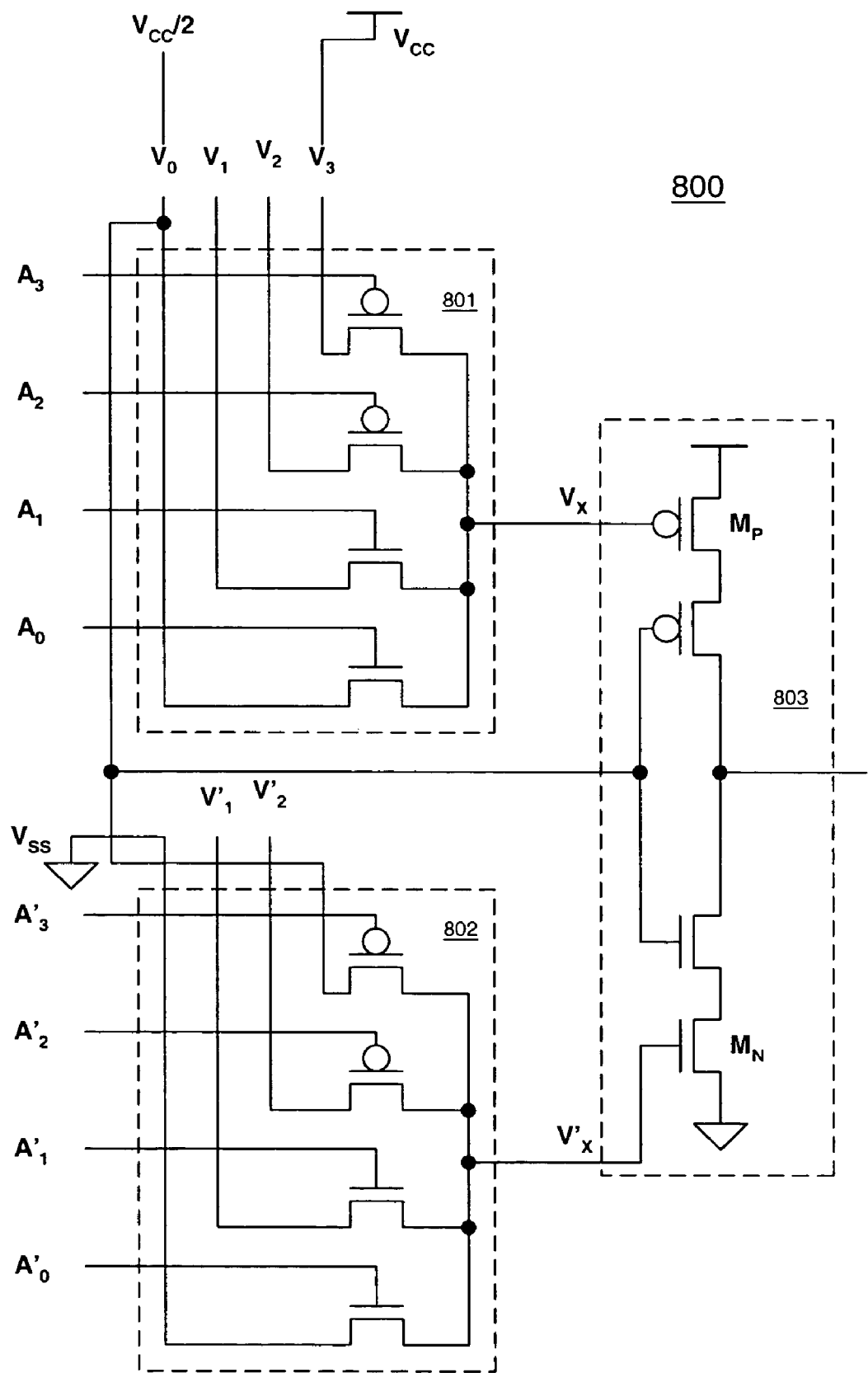
FIG. 8 is a block diagram of a DC/DC converter according to another embodiment.

FIG. 8 is a block diagram of a DC/DC converter according to another embodiment. For example, the DC/DC converter example 800 may be implemented as an example of the DC/DC converter 100 of FIG. 1 and/or the DC/DC converter 600 of FIG. 6. Similar to those shown in FIGS. 6 and 7, the DC/DC converter example 800 includes one or more stepwise drivers 801-802 to drive one or more power switches 803 of the DC/DC converter. In this embodiment, for the purposes of illustration, the stepwise drivers 801-802 are illustrated as a 3-step driver similar to the one shown in FIG. 5A. However, they are not so limited. More or less drivers and/or more or less steps in each driver may be implemented.

In addition, according to one embodiment as shown in FIG. 8, the power switch 803 may operate from $V_{CC}$ of approximately twice the maximum voltage rating of the transistors. The driver 801 generates voltage swing between $V_{CC}/2$ and $V_{CC}$, and driver 802 generates voltage swing between $V_{SS}$ and $V_{CC}/2$. In one embodiment, the $V_{CC}/2$ rail is shared and facilitates recycling of charge from driver 801 into driver 802. As a result, power is saved. Further, the intermediate voltage rails can be decoupled by using one or more AC coupling devices, for example, capacitors, connected to other intermediate rails or to any of $V_{SS}$, $V_{CC}/2$, $V_{CC}$. Alternatively, flexible sharing scheme shown in FIG. 9 may be utilized.

Figure 9:
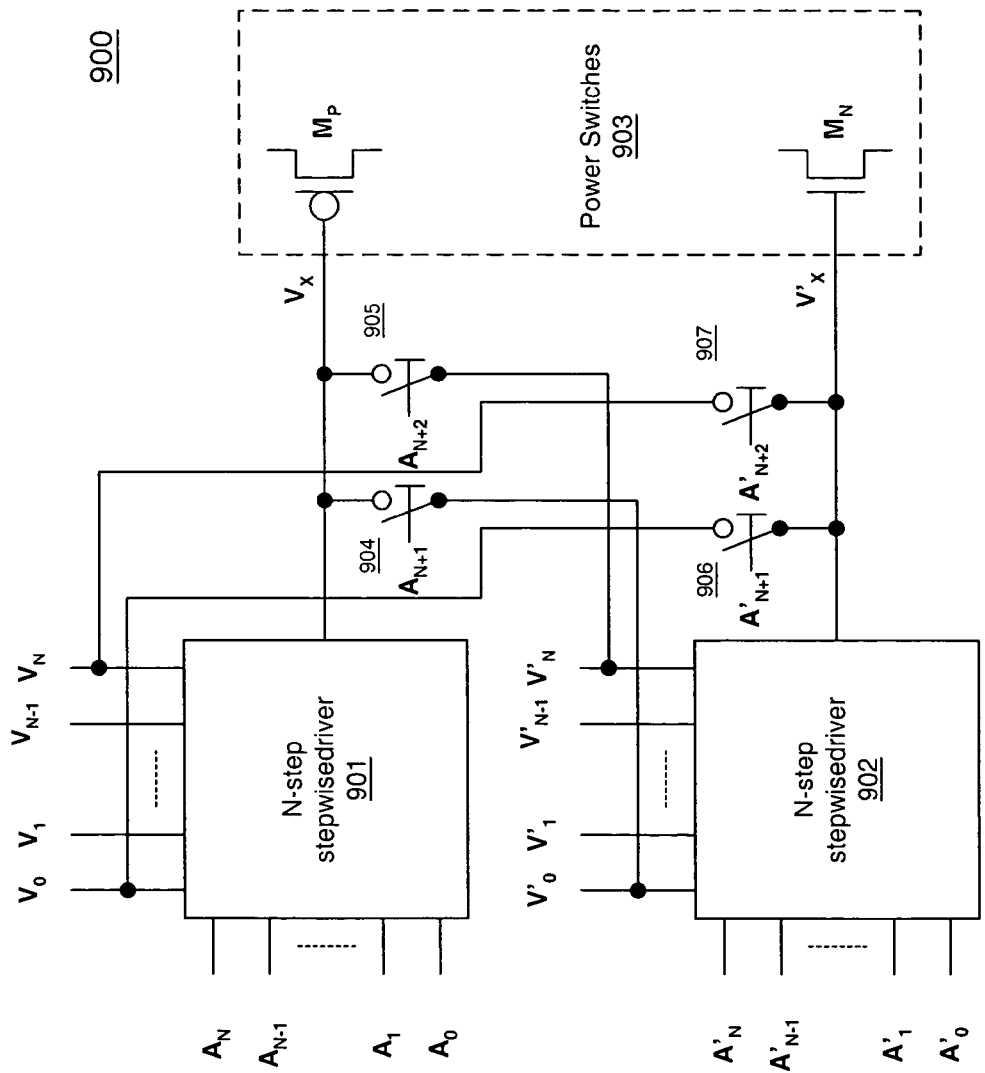
FIG. 9 is a block diagram of a DC/DC converter according to another embodiment.

FIG. 9 is a block diagram of a DC/DC converter according to another embodiment. For example, the DC/DC converter example 900 may be implemented as an example of the DC/DC converter 100 of FIG. 1 and/or the DC/DC converter 600 of FIG. 6. Similar to those shown in FIGS. 6-8, the DC/DC converter example 900 includes one or more stepwise drivers 901-902 to drive one or more power switches 903 of the DC/DC converter. However, more or less drivers and/or more or less steps in each driver may be implemented.

In addition, additional switches 904-907 are used to cross couple the outputs of one driver to a supply rail of another driver. The additional switches 904-907 create the opportunity for charge recycling among the drivers 901 and 902 when operating conditions are favorable. For example, if $V_N = V_{CC}$, $V_0 = V_{CC}/2 = V'_N$, then switch connected to $A'_{N+1}$ can turn on instead of $A'_N$ and emulate the scheme shown in FIG. 8. Depending on the power consumption of each of the drivers and the anticipated voltages, some of the switches may be added or omitted.

Figure 10:
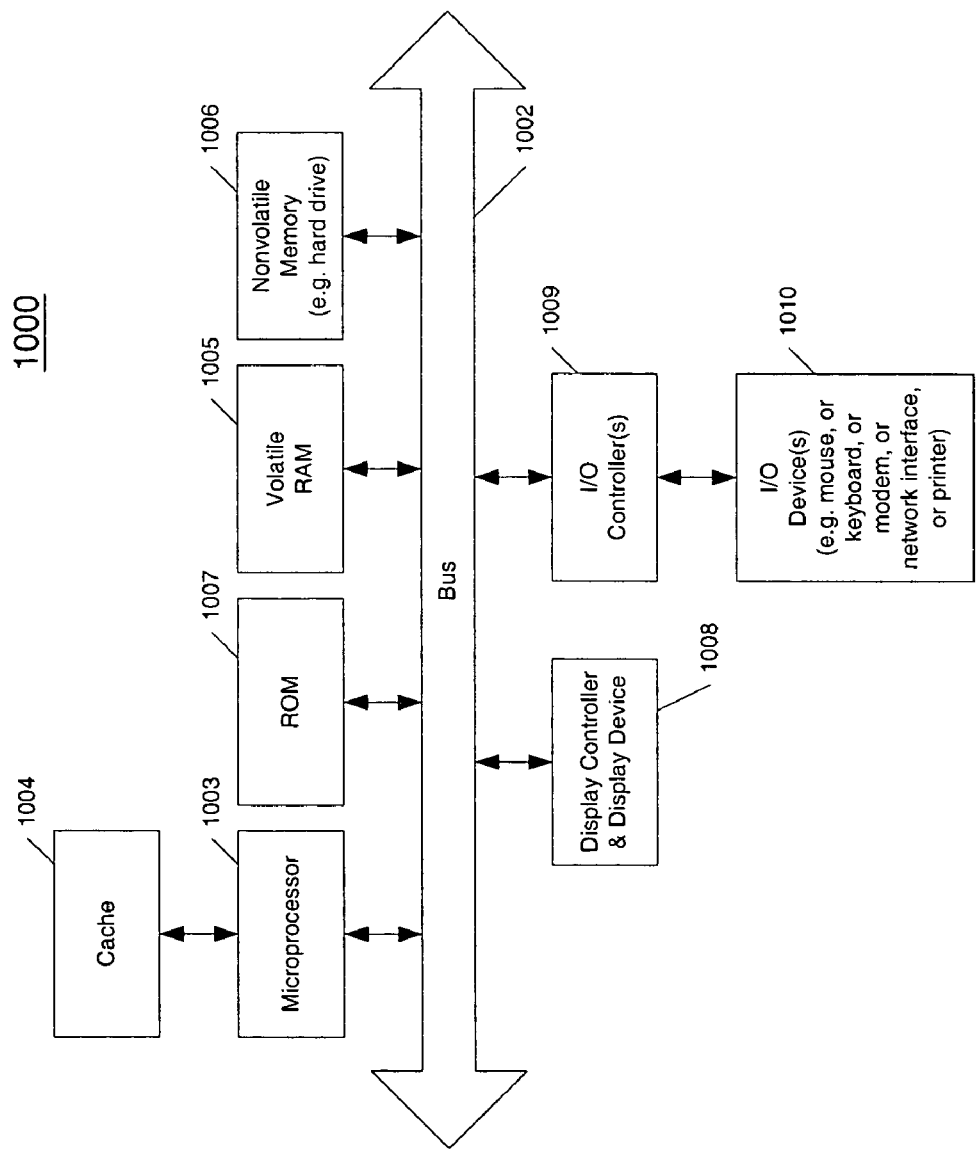
FIG. 10 is a block diagram of a computer example which may be used with an embodiment.

FIG. 10 is a block diagram of a computer example which may be used with an embodiment. For example, some or all components of system 1000 shown in FIG. 10 may be powered using one or more DC/DC converters similar to those shown in FIGS. 1 and 6-9. Any one of the DC/DC converters may include a stepwise driver, similar to those shown in FIGS. 2-3, 4A, and 5A, to drive a power switch of the converter. Note that while FIG. 10 illustrates various components of a computer system, it is not intended to represent any particular architecture or manner of interconnecting the components, as such details are not germane to the present invention. It will also be appreciated that network computers, handheld computers, cell phones, and other data processing systems which have fewer components or perhaps more components may also be used with the present invention.

As shown in FIG. 10, the computer system 1000, which is a form of a data processing system, includes a bus 1002 which is coupled to a microprocessor 1003 and a ROM 1007, a volatile RAM 1005, and a non-volatile memory 1006. The microprocessor 1003, which may be, for example, a Pentium processor from Intel Corporation or a PowerPC processor from Motorola, Inc., is coupled to cache memory 1004 as shown in the example of FIG. 10. The bus 1002 interconnects these various components together and also interconnects these components 1003, 1007, 1005, and 1006 to a display controller and display device 1008, as well as to input/output (I/O) devices 1010, which may be mice, keyboards, modems, network interfaces, printers, and other devices which are well-known in the art. These components may be coupled to each other via one or more interconnects having a receiver circuit similar to those shown in FIGS. 5 and 6.

Typically, the input/output devices 1010 are coupled to the system through input/output controllers 1009. The volatile RAM 1005 is typically implemented as static RAM (SRAM) or dynamic RAM (DRAM) which requires power continuously in order to refresh or maintain the data in the memory. The non-volatile memory 1006 is typically a magnetic hard drive, a magnetic optical drive, an optical drive, or a DVD ROM or other type of memory system which maintains data even after power is removed from the system. Typically, the non-volatile memory will also be a random access memory, although this is not required. While FIG. 10 shows that the non-volatile memory is a local device coupled directly to the rest of the components in the data processing system, it will be appreciated that the present invention may utilize a non-volatile memory which is remote from the system; such as, a network storage device which is coupled to the data processing system through a network interface such as a modem or Ethernet interface.

The bus 1002 may include one or more buses connected to each other through various bridges, controllers, and/or adapters, as is well-known in the art. In one embodiment, the I/O controller 1009 includes a USB (Universal Serial Bus) adapter for controlling USB peripherals or a PCI controller for controlling PCI devices, which may be included in IO devices 1010. In a further embodiment, I/O controller 1009 includes an IEEE-1394 controller for controlling IEEE-1394 devices, also known as FireWire devices. Other components may also be implemented.

Thus, stepwise drivers for DC/DC converters have been described. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A driver circuit, comprising:
a plurality of switching elements to sequentially switch to charge a gate capacitance of a power switch of a DC/DC converter from a first voltage to a second voltage in a plurality of steps; and
a plurality of supply rails coupled to the plurality of switching elements respectively to provide a plurality of voltages including the first voltage, the second voltage, and at least one intermediate voltage between the first and second voltages, wherein the gate capacitance of the power switch is charged from the first voltage to the at least one intermediate voltage via a respective switching element before being charged to the second voltage,
wherein at least one intermediate supply rail that provides the at least one intermediate voltage is coupled to the first supply rail via a capacitor in series between the at least one intermediate supply rail and the first supply rail, and
wherein the capacitor is to store energy when the gate capacitance of the power switch is discharged from the second voltage to the at least one intermediate voltage or from the at least one intermediate voltage to the first voltage, and wherein the stored energy is used to charge the gate capacitance from the first voltage to the at least one intermediate voltage or from the at least one intermediate voltage to the second voltage in a subsequent switching cycle of the DC/DC converter without drawing power from a power supply.

2. The driver circuit of claim 1, further comprising an input circuit to receive a plurality of control signals to cause the plurality of switching elements to switch respectively.

3. The driver circuit of claim 2, wherein each of the plurality of control signals is to control each of the plurality of switching elements independently.

4. The driver circuit of claim 1, wherein only one of the switching elements is turned on while a remainder of the switching elements are turned off during one of the plurality of steps.

5. The driver circuit of claim 1, wherein the gate capacitance of the power switch is charged in a plurality of steps within a single switching cycle of the DC/DC converter.

6. The driver circuit of claim 1, wherein the gate capacitance of the power switch is discharged in a plurality of steps within a single switching cycle of the DC/DC converter.

7. The driver circuit of claim 1, wherein after the gate capacitance of the power switch is charged to the second voltage, the plurality of switching elements is to sequentially switch to discharge the gate capacitance of the power switch from the second voltage to the first voltage.

8. The driver circuit of claim 7, wherein during discharging the gate capacitance of the power switch, the plurality of switching elements sequentially switches in a reversed order with respect to a switching order when charging the gate capacitance of the power switch.

9. A DC/DC converter, comprising:
a power switch;
a driver circuit coupled to the power switch, the driver circuit including a plurality of switching elements to sequentially switch to charge a gate capacitance of the power switch from a first voltage to a second voltage in a plurality of steps; and
a plurality of supply rails coupled to the plurality of switching elements respectively to provide a plurality of voltages including the first voltage, the second voltage, and at least one intermediate voltage between the first and second voltages, wherein the gate capacitance of the power switch is charged from the first voltage to the at least one intermediate voltage via a respective switching element before being charged to the second voltage,
wherein at least one intermediate supply rail that provides the at least one intermediate voltage is coupled to the first supply rail via a capacitor in series between the at least one intermediate supply rail and the first supply rail, and
wherein the capacitor is to store energy when the gate capacitance of the power switch is discharged from second voltage to the at least one intermediate voltage or from the at least one intermediate voltage to the first voltage, and wherein the stored energy is used to charge the gate capacitance from the first voltage to the at least one intermediate voltage or from the at least one intermediate voltage to the second voltage in a subsequent switching cycle of the DC/DC converter without drawing power from a power supply.

10. The DC/DC converter of claim 9, wherein the driver circuit further comprises an input circuit to receive a plurality of control signals to cause the plurality of switching elements to switch respectively.

11. The DC/DC converter of claim 10, wherein each of the plurality of control signals is to control each of the plurality of switching elements independently.

12. The DC/DC converter of claim 9, wherein only one of the switching elements is turned on while a remainder of the switching elements are turned off during one of the plurality of steps.

13. The DC/DC converter of claim 9, wherein the gate capacitance of the power switch is charged in a plurality of steps within a single switching cycle of the DC/DC converter.

14. The DC/DC converter of claim 9, wherein the gate capacitance of the power switch is discharged in a plurality of steps within a single switching cycle of the DC/DC converter.

15. The DC/DC converter of claim 9, wherein after the gate capacitance of the power switch is charged to the second voltage, the plurality of switching elements is to sequentially switch to discharge the gate capacitance of the power switch from the second voltage to the first voltage.

16. The DC/DC converter of claim 15, wherein during discharging the gate capacitance of the power switch, the plurality of switching elements sequentially switches in a reversed order with respect to a switching order when charging the gate capacitance of the power switch.

17. A data processing system, comprising:
a bus;
a processor coupled to the bus;
one or more devices coupled to the bus; and
a DC/DC converter to provide a supply voltage to at least one of the processor and the one or more devices, the DC/DC converter including
a power switch to switch to provide the DC supply voltage,
a driver circuit coupled to the power switch, the driver circuit including a plurality of switching elements to sequentially switch to charge a gate capacitance of the power switch from a first voltage to a second voltage in a plurality of steps, and
a plurality of supply rails coupled to the plurality of switching elements respectively to provide a plurality of voltages including the first voltage, the second voltage, and at least one intermediate voltage between the first and second voltages, wherein the gate capacitance of the power switch is charged from the first voltage to the at least one intermediate voltage via a respective switching element before being charged to the second voltage, wherein at least one intermediate supply rail that provides the at least one intermediate voltage is coupled to the first supply rail via a capacitor in series between the at least one intermediate supply rail and the first supply rail, and wherein the capacitor is to store energy when the gate capacitance of the power switch is discharged from the second voltage to the at least one intermediate voltage or from the at least one intermediate voltage to the first voltage, and wherein the stored energy is used to charge the gate capacitance from the first voltage to the at least one intermediate voltage or from the at least one intermediate voltage to the second voltage in a subsequent switching cycle of the DC/DC converter without drawing power from a power supply.

18. The data processing system of claim 17, wherein the driver circuit further comprises an input circuit to receive a plurality of control signals to cause the plurality of switching elements to switch respectively.

19. The data processing system of claim 17, wherein only one of the switching elements is turned on while a remainder of the switching elements are turned off during one of the plurality of steps.

20. The data processing system of claim 17, wherein after the gate capacitance of the power switch is charged to the second voltage, the plurality of switching elements is to sequentially switch to discharge the gate capacitance of the power switch from the second voltage to the first voltage.

21. The data processing system of claim 19, wherein during discharging the gate capacitance of the power switch, the plurality of switching elements sequentially switches in a reversed order with respect to a switching order when charging the gate capacitance of the power switch.

22. A method, comprising:

receiving a plurality of control signals; and sequentially switching a plurality of switching elements to charge a gate capacitance of a power switch of a DC/DC converter in a plurality of steps within a single switching cycle of the DC/DC converter, in response to the plurality of control signals respectively, wherein the DC/DC converter further comprises a driver circuit coupled to the power switch, the driver circuit including the plurality of switching elements to sequentially switch to charge a gate capacitance of the power switch from a first voltage to a second voltage in a plurality of steps, and a plurality of supply rails coupled to the plurality of switching elements respectively to provide a plurality of voltages including the first voltage, the second voltage, and at least one intermediate voltage between the first and second voltages, wherein the gate capacitance of the power switch is charged from the first voltage to the at least one intermediate voltage via a respective switching element before being charged to the second voltage, wherein at least one intermediate supply rail that provides the at least one intermediate voltage is coupled to the first supply rail via a capacitor in series between the at least one intermediate supply rail and the first supply rail, and wherein the capacitor is to store energy when the gate capacitance of the power switch is discharged from the second voltage to the at least one intermediate voltage or from the at least one intermediate voltage to the first voltage, and wherein the stored energy is used to charge the gate capacitance from the first voltage to the at least one intermediate voltage or from the at least one intermediate voltage to the second voltage in a subsequent switching cycle of the DC/DC converter without drawing power from a power supply.

23. The method of claim 22, wherein sequentially switching comprises turning on only one of the switching elements while a remainder of the switching elements remains turned off during one of the plurality of steps.

24. The method of claim 22, further comprising sequentially switching the plurality of switching elements in a reversed order to discharge the gate capacitance of the power switch from the second voltage to the first voltage, after the gate capacitance of the power switch has been charged to the second voltage.

* * * * *